(12) United States Patent
 Askan

(10) Patent No.: US 12,695,289 B2
(45) Date of Patent: Jul. 28, 2026

(54) CIRCUIT BREAKER

(71) Applicant: EATON INTELLIGENT POWER LIMITED, Dublin (IE)

(72) Inventor: Kenan Askan, Vienna (AT)

(73) Assignee: EATON INTELLIGENT POWER LIMITED, Dublin (IE)

( * ) Notice: Subject to any disclaimer, the term of this patent is extended or adjusted under 35 U.S.C. 154(b) by 187 days.

(21) Appl. No.: 18/836,054

(22) PCT Filed: Feb. 8, 2023

(86) PCT No.: PCT/EP2023/025058
  § 371 (c)(1),
  (2) Date: Aug. 6, 2024

(87) PCT Pub. No.: WO2023/151869
  PCT Pub. Date: Aug. 17, 2023

(65) Prior Publication Data
  US 2025/0047089 A1    Feb. 6, 2025

(30) Foreign Application Priority Data

Feb. 8, 2022   (GB) ..................................... 2201606

(51) Int. Cl.
  *H02H 3/08*      (2006.01)
  *H03K 17/567*    (2006.01)
  *H03K 17/687*    (2006.01)
(52) U.S. Cl.
  CPC ............. *H02H 3/08* (2013.01); *H03K 17/567* (2013.01); *H03K 17/687* (2013.01)
(58) Field of Classification Search
  CPC .. H01H 9/541; H01H 9/542; H01H 2009/543; H01H 2009/544;

(Continued)

(56) References Cited

U.S. PATENT DOCUMENTS

2016/0322184 A1* 11/2016 Schmitz ................... H01H 9/56
2019/0229525 A1*  7/2019 Askan .................... H01H 9/542

FOREIGN PATENT DOCUMENTS

GB        2521188 A  *  6/2015  ............. H02H 3/044

OTHER PUBLICATIONS

May 23, 2023 International Search Report.
May 23, 2023 Written Opinion.

* cited by examiner

*Primary Examiner* — Kevin J Comber
(74) *Attorney, Agent, or Firm* — LEYDIG, VOIT & MAYER, LTD.

(57)        ABSTRACT

Some embodiments are directed towards an electric switching device including a first conductor path and a second conductor path, a first semiconductor circuit arrangement with a first—normally-off—semiconductor in the first conductor path, a first control and driver unit for driving the first semiconductor circuit arrangement and connected to the first conductor path and the second conductor path. It is suggested that the first semiconductor circuit arrangement can include a second semiconductor, that the second semiconductor is connected parallel to the first semiconductor, that the second semiconductor is a normally-on semiconductor, that the first semiconductor circuit arrangement includes a second control and driver unit configured to drive the second semiconductor with control signals. The second control and driver unit is connected parallel to the second semiconductor.

25 Claims, 3 Drawing Sheets

(58) Field of Classification Search
CPC .... H01H 2009/546; H02H 3/08; H02H 3/105;
H02H 3/24; H03K 17/567; H03K 17/687
USPC ....................................................... 361/101
See application file for complete search history.

CIRCUIT BREAKER

CROSS-REFERENCE TO RELATED APPLICATIONS

This application is a national phase filing under 35 C.F.R. § 371 of and claims priority to PCT Patent Application No. PCT/EP2023/025058, filed on Feb. 8, 2023, which claims the priority benefit under 35 U.S.C. § 119 of British Patent Application No. 2201606.7, filed on Feb. 8, 2022, the contents of which are hereby incorporated in their entireties by reference.

BACKGROUND

The present disclosure relates to an electric switching device.

Protection against electrical fault currents such as over currents, short-circuit currents and residual currents is useful and is compulsory in electrical devices in most countries worldwide.

Existing fault prevention devices include electromechanical miniature circuit breakers (MCBs), residual current devices (RCDs) and residual current breakers with overcurrent (RBCOs).

A disadvantage of electromechanical systems such as MCBs, RCBOs, RCDs is that the electric arc that is generated during opening of the electromechanical contact under current has detrimental effect on the lifespan of the contact.

An alternative to electromechanical circuit breaking systems is to use circuit breakers based on hybrid circuit breakers (HBCs) or solid-state circuit breakers (SSCBs) where total arc-free switching is possible. However, current HCBs and SSCBs require a power supply to control semiconductor switches and electromechanical switches. Therefore, such devices are not generally functional in the absence or failure of a power supply for controlling the switches.

There are also challenges with combining known HCBs/SSCBs with VI RCDs. In particular, when there is no auxiliary power supply available or an internal power supply fails, known HCBs/SSCBs provide an open circuit. Where the circuit is open, no current path is available through the VI RCD and no voltage independent residual current detection is possible.

Circuit breaker elements including self-powered switching elements that are able turn off without receiving power from an auxiliary power supply have been discussed in the prior art, such as U.S. Pat. No. 9,543,751 B2. However, these devices provide electric fault protection only in the case of a short-circuit condition.

Therefore, there is a need to provide a fault protection device that overcomes the disadvantages of known fault protection devices.

SUMMARY OF INVENTION

According to the presently disclosed subject matter, the aforementioned object is solved by the features of claim 1.

In one aspect of the disclosure, an electric switching device (30), especially a hybrid switching device or a solid-state switching device, is provided. The electric switching device comprises a first conductor path (2) arranged between a power source and a load, a first semiconductor circuit arrangement (11) of the electric switching device (30) arranged in the first conductor path (2). The first semiconductor circuit arrangement (11) comprises at least a first semiconductor switch (12), wherein the first semiconductor switch (12) is a normally-off semiconductor switch, a first control and driver unit (13) configured to drive the first semiconductor circuit arrangement (11) with control signals, wherein the first control and driver unit (13) is connected to an internal power supply (18), which is connected to the first conductor path (2), at least a second semiconductor switch (14), wherein the second semiconductor switch (14) is connected parallel to the first semiconductor switch (12), and wherein the second semiconductor switch (14) is a normally-on semiconductor, and a second control and driver unit (15) configured to drive the second semiconductor switch (14) with control signals when the internal power supply and control unit (18) is not active or is incapable of supplying power to the first control and driver unit (13).

In some examples, the second control and driver unit (15) does not receive power from the control and power supply unit (18).

In some examples, the second control and driver unit (15) and the second semiconductor switch (14) are configured such that when a voltage difference across the second control and driver unit (15) and the second semiconductor switch (14) exceeds a threshold voltage, the control and driver unit (15) is activated and controls the second semiconductor switch (14) to be turned off.

In some examples, the second control and driver unit (15) is connected in parallel to the second semiconductor switch (14).

In some examples, the electric switching device further comprises a second conductor path (5) and a voltage-independent residual current device (10), the voltage-independent residual current device having at least one switchable mechanical contact along the first current path in series with the first semiconductor circuit arrangement (11), the voltage-independent residual current device being configured to break the circuit by opening the at least one mechanical contact in the event that it detects a residual current between the first conductor path (2) and the second conductor path (5).

In some examples, the voltage-independent residual current device (10) is configured to send a signal to the second control and driver unit (15) on detection of a residual current causing the second semiconductor switch (14) to turn off. Preferably, the second control and driver unit 15 is powered by the voltage-independent RCD. This is to say that the voltage generated by the summation transformer and electronics circuit converting this summation current to voltage, is further used to active the control and driver unit 15 after having been triggered opening mechanism for the contacts 101 and 102.

In some examples, the first control and driver unit (13) is configured to turn on the first semiconductor switch (12) in the absence of a fault condition when provided with sufficient power from the power supply unit (18).

In some examples, the first control and driver unit (13) is configured to turn off the first semiconductor switch (12) when a fault condition is detected.

In some examples, the second control and driver unit (15) is configured to detect an overcurrent condition falling within a specified time-current curve and, based on detecting the overcurrent condition falling within the specified time-current curve, provide power and a signal to the first control and driver unit (13) to turn on the first semiconductor switch (12).

In some examples, the second control and driver unit (15) is configured to switch off the second semiconductor switch (14) if a source voltage at the first conductor path (2) is under a predefined level and if the first control and driver unit (13)

is in a deactivated state, and if a fault current, over and short-circuit currents, is flowing at least in the first conductor path (2).

In some examples, a mechanical bypass switch (8) is arranged in the first conductor path (2), the mechanical bypass switch (8) is connected in parallel to the first semiconductor circuit arrangement (11).

In some examples, the first semiconductor circuit arrangement (11) is connected via a rectifier (16) with the first conductor path (2).

In some examples, the first semiconductor circuit arrangement (11) is embodied as bridge circuit.

In some examples, the first control and driver unit (13) is connected to the second control and driver unit (15) and/or the second semiconductor switch (14).

In some examples, the first semiconductor switch (12) is an IGBT or enhancement-FET.

In some examples, the second semiconductor switch (14) is a JFET.

In some examples, the electric switching device further comprises a voltage-independent residual-current device (10).

In some examples, wherein the voltage-independent residual-current device (10) is connected to the second control and driver unit (15) which is able to activate the second control driver unit (15) in case of detecting a residual current.

In some examples, the electric switching device further comprises at least a first normally-closed galvanic separation relay (26) arranged in the first conductor path (2) of the low-voltage protective device (1).

In some examples, the control and power supply unit (18) is configured to trigger opening of contacts of the voltage-independent RCD (10) by simulating residual current the electronic unit of the voltage-independent RCD (10) to provide safe isolation in case of detection of overcurrent and or short circuit current conditions.

In some examples, the electric switching device further comprises a normally open galvanic separation relay (26) arranged in the first conductor path (2) of the electric switching device.

In some examples, the normally open galvanic separation relay (26) is disposed between a voltage independent residual current device and the load, and wherein an additional output connection (21) is disposed between the voltage independent residual current device (10) and the normally open galvanic separation relay (26).

In some examples, the electric switching device is formed as a complete circuit breaker built in a common house.

In some examples, the voltage-independent residual current device (10) is connected to the power supply and control unit (18).

In some examples, in the case that the internal power supply and control unit (18) is not active or is incapable of supplying power, the self-powered second control and driver unit (15) is configured to activate the not-self powered first control and driver unit (13) to turn on the normally-off first semiconductor switch (12) during overcurrent conditions within a predefined time-current curve.

In some examples, the first control and driver unit (13) is configured to control the second semiconductor switch (14) when the internal power supply and control unit (18) supplies sufficient power to activate the first control and driver unit (13).

In some examples, the first control and driver unit (13) is connected with the second control and driver unit (15) and configured to deactivate the second control and driver unit

(15) when the internal power supply and control unit (18) supplies sufficient power to activate the first control and driver unit (13).

In another aspect of the disclosure, an electric switching device (30), especially a hybrid switching device or a solid-state switching device is provided. The Electric switching device comprises: a first conductor path (2) and a second conductor path (5), a first semiconductor circuit arrangement (11) of the electric switching device (30) arranged in the first conductor path (2), the first semiconductor circuit arrangement (11) comprising at least a first semiconductor (12), whereby the first semiconductor (12) is a normally-off semiconductor, preferably the first semiconductor (12) is embodied as IGBT or enhancement-FET, a first control and driver unit (13) configured to drive the first semiconductor circuit arrangement (11) with control signals, whereby the first control and driver unit (13) is connected to the first conductor path (2) and the second conductor path (5), characterised in, that the first semiconductor circuit arrangement (11) comprises at least a second semiconductor (14), that the second semiconductor (14) is connected parallel to the first semiconductor (12), that the second semiconductor (14) is a normally-on semiconductor, preferably the second semiconductor (14) is embodied as JFET, that the first semiconductor circuit arrangement (11) comprises a second control and driver unit (15) configured to drive the second semiconductor (14) with control signals, and that the second control and driver unit (15) is connected parallel to the second semiconductor (14).

In some examples, the second control and driver unit (15) is embodied to switch off the second semiconductor (14) if a source voltage at the first conductor path (2) and the second conductor path (5) is under a predefined level and if the first control and driver unit (13) is in a deactivated state, and if a fault current is flowing in the first conductor path (2). The dependent claims describe further preferred embodiments of the presently disclosed subject matter.

The presently disclosed subject matter is described with reference to the drawings. The drawings show only exemplary embodiments of the presently disclosed subject matter.

BRIEF DESCRIPTION OF THE FIGURES

FIG. 1b illustrates a modification of the first preferred embodiment of FIG. 1a;

FIG. 2b shows a modification of the second preferred embodiment of FIG. 2a;

DETAILED DESCRIPTION

FIGS. 1a to 4 illustrate an electric switching device 30 (or low-voltage protective device).

Figure 1A:
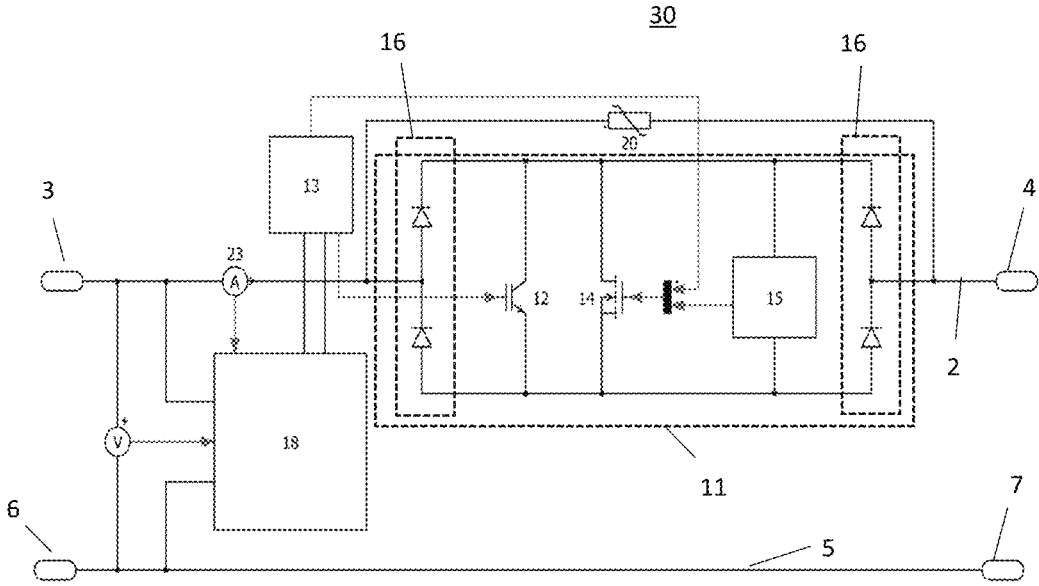
FIG. 1a illustrates a first preferred embodiment of an electric switching device as solid state switching device.
Figure 1B:
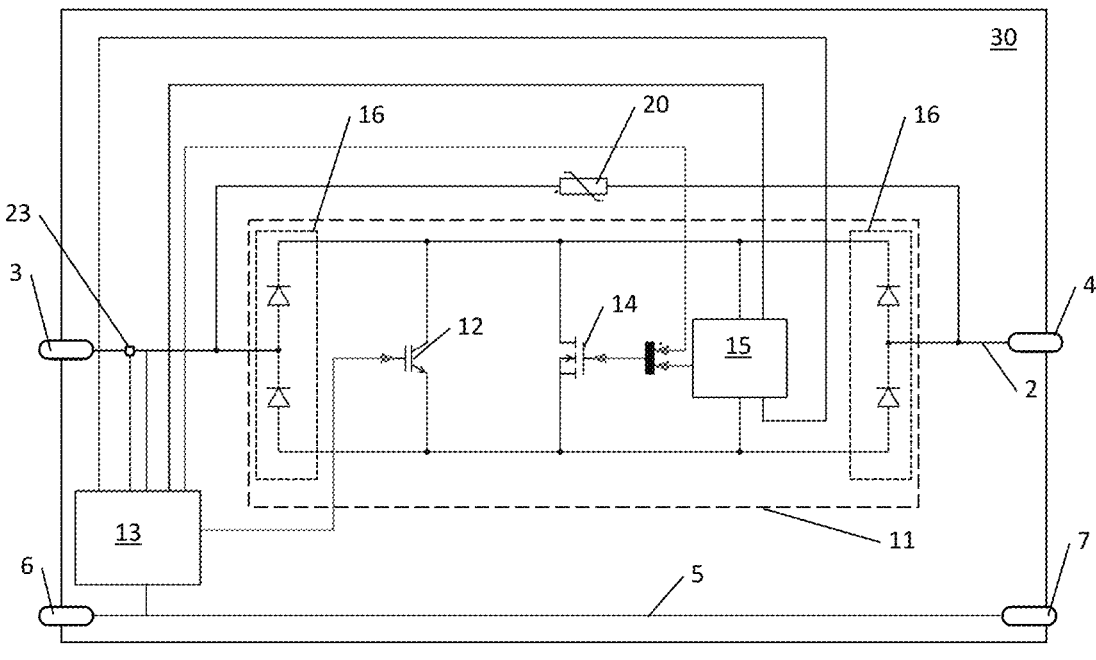

The electric switching device 30 of FIGS. 1a and 1b comprise a first semiconductor circuit arrangement 11 disposed on a conductive path between a power supply connection 3 at a first end and a load connection 4 at a second end. The first semiconductor circuit arrangement 11 comprises a first semiconductor switch 12 and a second semiconductor switch 14 arranged in parallel. The first semiconductor switch is configured to be normally-off in the absence of a control signal and, preferably, comprises an insulated-gate bipolar transistor (IGBT) or an enhancement field-effect transistor (FET), such as a MOSFET. The second semiconductor switch 14 is configured to be normally-on in the absence of a control signal and, preferably, comprises a SiC junction-gate field-effect transistor (JFET).

First semiconductor switch 12 is controlled by non-self-powered first control and driver unit 13. In the embodiment of FIG. 1b, described in detail below, the non-self-powered first control and driver unit 13 is powered by a power supply 18 to which it is electrically connected. The first control and driver unit 13, when provided with power from the power supply 18, controls the first semiconductor switch 12 to be turned on in the absence of any detected fault conditions to provide a conductive path between the power supply connection 3 and the load connection 4. When no power supply is available to the first control and driver unit 13, no control signal is provided to the first semiconductor switch 12, which therefore reverts to its normally-off state. Under these conditions, the power supply connection 3 is electrically connected to the load connection 4 via only the second semiconductor 14 and not the first semiconductor 12. This arrangement therefore allows the power supply connection 3 to remain connected to the load connection 4 when no auxiliary power is supplied to the second control and driver unit 15. FIG. 1b illustrates a modification of the embodiment of FIG. 1b where the first control and driver unit 13 draws power from the source without a power supply unit 18.

Normally-on second semiconductor switch 14 is controlled at least in part by self-powered second control and driver unit 15. The second control and driver unit 15 is self-powered in that no connection to a power supply is necessary for its operation as it is able to operate using power derived from short circuit currents or overcurrents. For example, in a short circuit condition, a large voltage drop is generated across both the second semiconductor 14 and the driver unit 15 as the resistance of the second semiconductor 14 becomes a large proportion of the total circuit resistance. The large voltage across the self-powered second control and driver unit 15 is used to power the self-powered second control and driver unit 15 and turn off the normally-on second semiconductor 14. This voltage can be clamped by the second control and driver unit 15 so that the normally-on second semiconductor 14 remains off until the fault is resolved. Therefore, the switching device of FIG. 1 allows the circuit to be protected from short circuits and fault currents even in the absence of a functioning power supply. U.S. Pat. No. 9,543,751 B2 provides an example of a circuit including self-powered control and circuit breaking capabilities. Normally-on second semiconductor switch 14 may also receive control signals from the non-self-powered first control and driver unit 13 when power supply is available.

When power from power supply 18 is available, normally-off first semiconductor switch 12 is controlled by the first control and driver unit 13 to be turned on and off. When no electrical fault condition is detected, the first semiconductor 12 is turned on and thereby provides a current path from power supply connection 3 to load connection 4. When no fault conditions are detected, the first control and driver unit 13 may control the second semiconductor switch 14 to be in off-state. As such, only the first semiconductor switch 12 and not the second semiconductor switch 14 is be used to conduct current under these conditions. This is advantageous the second semiconductor switch 14 may have a lower capacity for current conduction than the first semiconductor switch 14. First semiconductor switch 12 is preferably an IGBT and provides a robust current path between the source 3 and the load 4, which prevents excessive current being directed through the normally-on second semiconductor switch 14 and prevents thermal runaway of the second semiconductor. The normally-on second semiconductor 14 is preferably sized to conduct only residual fault currents. As a result of this, it is possible to have large voltage drop across second semiconductor switch 14 even at small short-circuit and over-currents so that the driver 15 can be activated even at small amount of fault current. If the power supply 18 fails to provide sufficient power to the first control and driver unit 13, the first control and driver unit 13 is unable to provide control signals to the first semiconductor switch 12, and the normally-off first semiconductor switch 12 reverts to a turned-off state unless it receives power from another portion of the circuit, such as the second control and driver unit 15. Under these conditions, the first control and driver unit 13 is also unable to provide control signals to the second semiconductor switch 14, which reverts to a turned-on state in the absence of a detected fault current.

The electric switching device 30 may have an outer conductor path 2 and a neutral conductor path 5. The outer conductor path 2 runs through the electric switching device 30 from an outer conductor power supply connection 3 to an outer conductor load connection 4. The neutral conductor path 5 runs through the electric switching device 30 from a neutral connection 6 to a neutral load connection 7. In some embodiments, the hybrid and solid-state switching part can be also placed in neutral line. The respective connections 3, 4, 6, 7 are preferably designed as screw connection terminals and/or plug-in terminals. The respective connections 3, 4, 6, 7 are preferably arranged at the electric switching device 30 in a manner allowing access from the outside. This means that if the electric switching device 30 is a part of another device, the respective connections 3, 4, 6, 7 may be part of the other device.

The electric switching device 30 preferably has—at least in sections—a housing of insulating material. Preferably all components of the electric switching device 30 are arranged in one housing. If the electric switching device 30 is part of another device, the housing of this device may be the housing of the electric switching device 30.

The electric switching device 30 comprises a first semiconductor circuit arrangement 11 arranged in the first conductor path 2. The first semiconductor circuit arrangement 11 is preferably embodied as bridge circuit 16. Furthermore, the first semiconductor 12 and the second semiconductor 14 are embodied in a diode rectifier bridge 16 to provide bidirectional current flow for AC or DC current.

Preferably, a varistor 20 is connected parallel to the first semiconductor circuit arrangement 11. A varistor 20 is also known as over-voltage protection device or voltage-dependent resistor. In some embodiments, the over-voltage protection device may be a transient-voltage-suppression diode (TVS). The above described circuit provides a range of functionality in normal operating conditions and under various fault conditions, as described in detail below.

Voltage Independent Functionality

The above circuit operates in a voltage independent mode when the source voltage is insufficient to activate the control and power supply unit 18 (or to otherwise supply power to the first control and driver unit 13). Under these conditions, the first non-self-powered control and driver unit 13 does not provide control signals to the first and second semiconductor switches.

In the absence of a fault condition, normally-off first semiconductor 12 switch reverts to its default off-state. The normally-on second semiconductor switch 14 reverts to its default on-state. A complete circuit path is provided between the input 3 and 6 and the output 4 and 7 via the second semiconductor switch 14.

The complete current path between the input and output allows the device to function without a power supply in the absence of a detected fault condition. By this arrangement, the presently disclosed subject matter makes its possible to have voltage independent circuit protection, residual current device, safe isolation and remote control capability which is based on power electronics switching for both hybrid and solid-state circuit breaker topologies.

Fault: Short Circuit

A short circuit causes a voltage drop across the second semiconductor switch 14 and the self-powered second control and driver unit 15. This causes the self-powered second control and driver unit 15 to be activated and turn off second semiconductor switch 14, disconnecting the load from the source.

Fault: Overcurrent Condition

In an overcurrent condition, the voltage drop across the second semiconductor switch 14 and the self-powered second control and driver unit 15 causes the second semiconductor switch 14 to turn off. Preferably, the second semiconductor switch 14 has a small active semiconductor area in order to achieve high sensitivity so that, even at small currents, a sufficient voltage drop across the second semiconductor device 14 occurs so that driver 15 can be activated. According to the time-current characteristics of various electrical fault protection specification, a circuit breaker should let through some time limited over-currents. However, the small active semiconductor area of the second semiconductor switch can lead to thermal run-away for conducting currents according to certain time-current curves (such as type B).

For overcurrent conditions allowed within a specified time-current curve, the self-powered driver unit 15 can be configured such that the voltage drop across the second semiconductor switch 14 and the self-powered second control and driver unit 15 is large enough to activate the not-self powered first control and driver unit 13 to turn on the normally-off first semiconductor switch 12, so that both the first and second semiconductor switches 12, 14 can conduct the allowed over-currents in parallel. The first semiconductor switch 12 comprises a sufficient semiconductor area to conduct and turn-off relatively high fault currents during hybrid operation during a short circuit event on solid-state switching to provide low on-state losses at normal current conditions. In case of an overcurrent condition exceeding the specified time-current curve (such as an excessively long overcurrent or a short circuit), self-powered second control and driver unit 15 turns off the first and second semiconductor switches 12, 14. In some embodiments, during the over-current conduction phase, the second semiconductor 14 may be turned so that only first semiconductor 12 conducts the current.

Voltage Dependent Functionality

The circuit of FIG. 1 operates in a voltage dependent mode when the source provides sufficient voltage to activate the internal control and power supply unit 18, which provides power to the first control and driver unit 13. During normal voltage dependent operation, first control and driver unit 13 provides control signals to first and second semiconductor switches 12, 14.

In the absence of a fault condition, the first control and driver unit 13 controls normally-off semiconductor switch 12 to be turned-on to allow to pass through. Normally-on second semiconductor switch device 14 is controlled by not-self-powered first control and driver unit 13 to be turned-off.

Fault: Short Circuit

Under a short circuit condition, the internal control and power supply unit 18 detects a fault by measuring an excessive current passing through the first conductor path 2 via a current measurement device 23 such as a shunt resistor. Upon detection of the short circuit condition, first semiconductor switch 12 is controlled to be switched off and second semiconductor switch 14 is controlled to remain in an off state.

Fault: Overcurrent

During an overcurrent condition, the first control and driver unit 13 controls normally-off semiconductor switch 12 to be turned-on to allow current through within specified allowed time-current curves. Once the overcurrent exceeds allowed time-current curves, the first semiconductor switch 12 is turned off to disconnect the source from the load.

In some embodiments, the electric switching device 30 comprises a first control and driver unit 13. The first control and driver unit 13 is at least configured to drive the first semiconductor circuit arrangement 11. The first control and driver unit 13 drives at least the first semiconductor 12 with control signals. In a preferred embodiment of the electric switching device 30, the first control and driver unit 13 also drives the second semiconductor 14. The first control and driver unit 13 uses the energy of the external power to which the electric switching device 30 is connected. For this electric energy supply, the first control and driver unit 13 is connected to the first conductor path 2 and the second conductor path 5. The first control and driver unit 13 is voltage dependent, and requires a supply voltage to operate. Typically, the first control and driver unit 13 require a source voltage of at least 50-70 V. Alternatively to the direct connection of the first control and driver unit 13 with the first conductor path 2 and the second conductor path 5 the low-voltage protective device 1 can comprise a selective power supply 18. In these embodiments the power supply 18 delivers the required supply voltage above 50-70 V to operate the first control and driver unit 13.

According to the first preferred embodiment as shown in FIG. 1 the electric switching device 30 is embodied as solid-state switching device, especially as solid-state switching device, without any mechanical switches in the first conductor path 2, which would be parallel to the first semiconductor circuit arrangement 11.

According to the second, the third and the fourth preferred embodiments, as shown in FIGS. 2a to 4, the electric switching device 30 (low-voltage protective device) is embodied as hybrid circuit switching device, especially as hybrid circuit breaker.

Figure 2A:
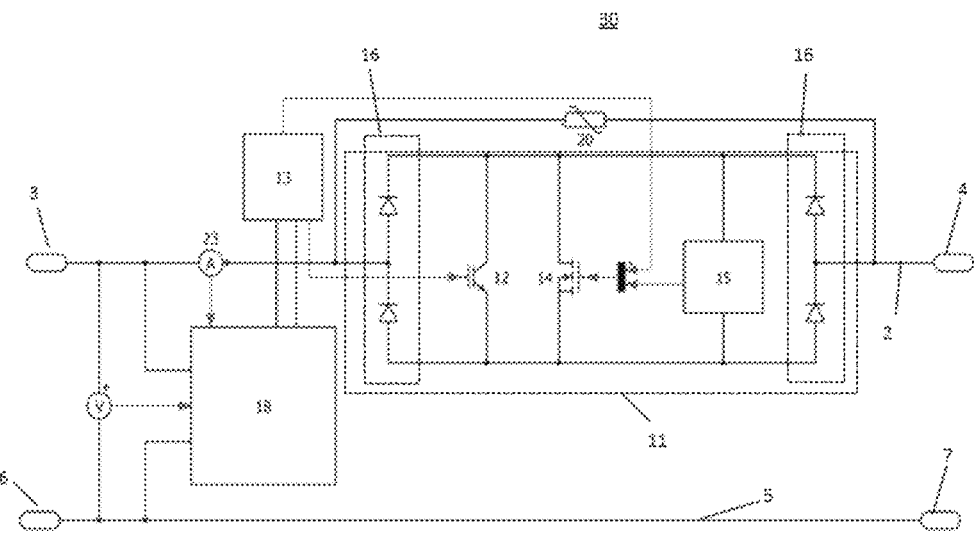
FIG. 2a shows a second preferred embodiment of an electric switching device as hybrid switching device.
Figure 2B:
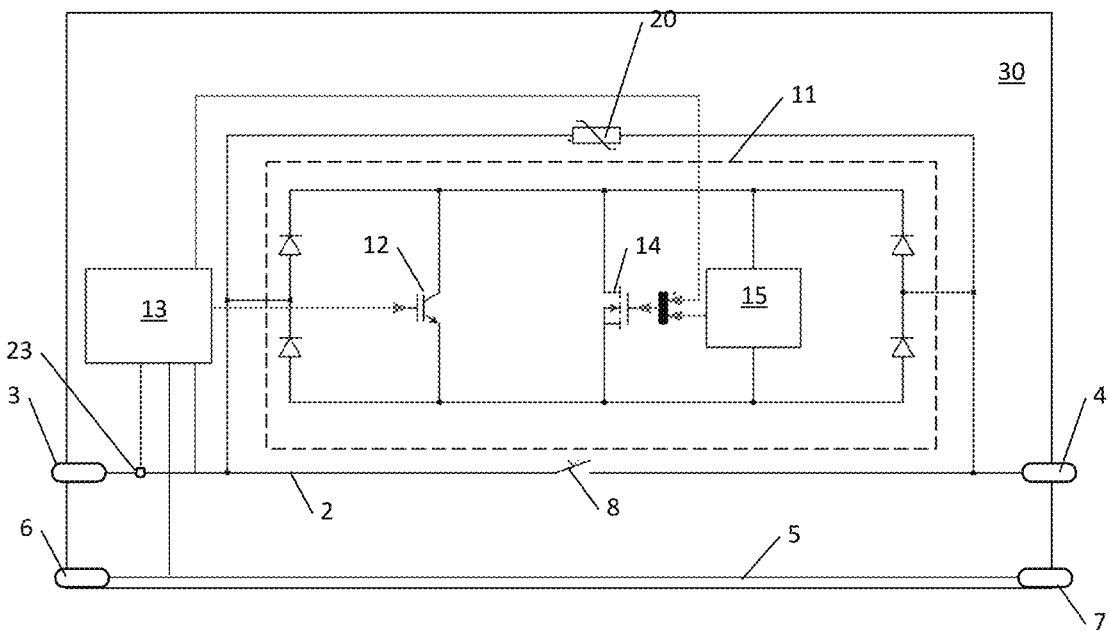

In the embodiment shown in FIG. 2a, the electric switching device 30 further comprises a mechanical bypass switch 8 which is arranged in the first conductor path 2. The mechanical bypass switch 8 is connected parallel to the first semiconductor circuit arrangement 11. The mechanical bypass switch 8 is driven by an individual relay driver 19 that receives power from the power supply 18. In an alternative embodiment, the electric switching device 30 comprises an individual relay driver 19 may be controlled by the first control and driver unit 13. Second semiconductor switch 14 may include two or more semiconductors that are switched in parallel in some embodiment. Such an arrangement is not shown in the illustrated preferred embodiments, as the voltage drop at these parallel switched transistors would be lower that the case where a single second semiconductor switch 14 is provided and may be sufficient to power the driver unit 15. FIG. 2b illustrates a modification of the embodiment of FIG. 2a, in which the first control and drive unit 13 receives power from the source without control and power unit 18.

The second semiconductor 14 is a normally-on semiconductor. Preferably the second semiconductor 14 is embodied as JFET. A JFET is a junction-gate field effect transistor. A JFET is a normally-on semiconductor. Especially the JFET is a Silicon Carbide (SiC)-JFET. A JFET is in a non-activated state always in an ON-position. That means, that an electrical connection exists through the JFET. However, this electrical connection of the JFET has a relatively high electrical resistance. This resistance is high enough to cause a voltage drop at the JFET to load or drive an electric device. The first semiconductor circuit arrangement 11 further comprises a second control and driver unit 15, which is connected parallel to the second semiconductor 14. The second control and driver unit 15 is a self-powered driver configured to drive or activate the second semiconductor 14 with control signals. As self-powered unit the second control and driver unit 15 operates only powered by a current at the JFET. An external power supply connection is therefore not required at the first conductor path 2 and the second conductor path 5 to activate the driver 15 so that it can change state of the second semiconductor switch 14 from ON to OFF by applying a negative gate voltage to the gate and source of the second semiconductor switch 14.

The second control and driver unit 15 can operate in states in which the first control and driver unit 13 is not active. This is to say that when the external power supply is not available. In particular, the first control and driver unit 13 might not be active, e.g. in a deactivated state, if a source voltage at the first power supply connection 3 and the second power supply connection 6 is under a predefined level, typically under 50-70 volts. The second control and driver unit 15 is embodied to switch off the second semiconductor 14, when an over current or short-circuit current flows in the first conductor path 2, at least in situations where the first control and driver unit 13 is deactivated.

As the fault current, in particular an over current or a short-circuit current, causes a voltage-drop at the JFET, whereby the second control and driver unit 15 is activated, a further current measuring device is not absolutely necessary. The second control and driver unit 15 can switch off the JFET after the second control and driver unit 15 is loaded, which only happens due to a fault current.

Preferably, the first control and driver unit 13 is connected with the second control and driver unit 15 to deactivate the second control and driver unit 15 as long as the first control and driver unit 13 is active. Furthermore, the first control and driver unit 13 could control the second control and driver unit 15 via this connection to switch off the JFET. The first control and driver unit 13 could also be connected directly to the second semiconductor 14 to switch off the second semiconductor 14.

Figure 3:
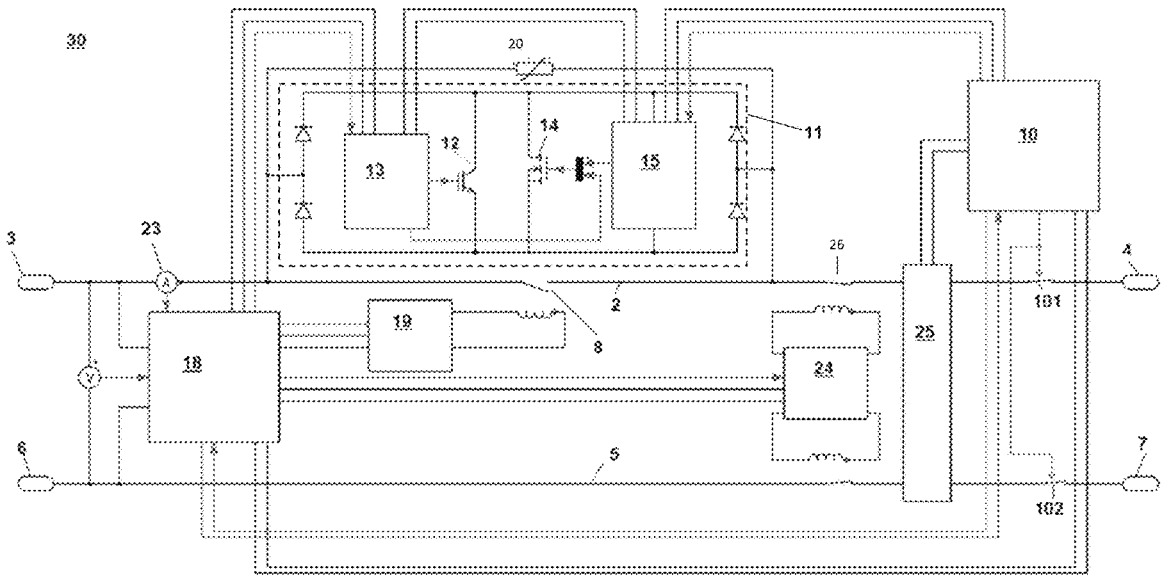
FIG. 3 shows a third preferred embodiment of an electric switching device as hybrid switching device as part of a low-voltage protective device.
Figure 4:
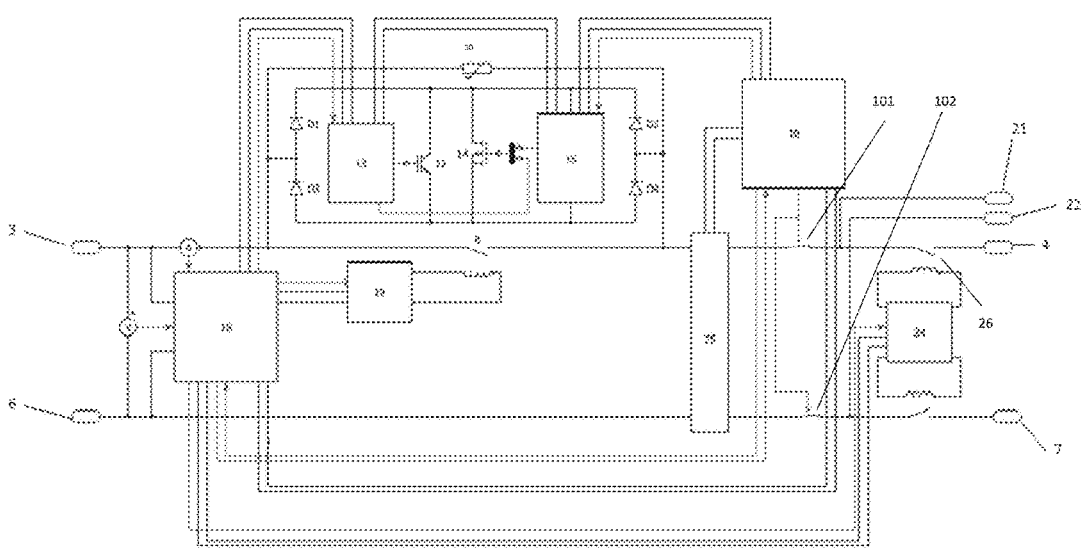
FIG. 4 shows a fourth preferred embodiment of an electric switching device as hybrid switching device as part of the low-voltage protective device.

According to a preferred embodiment, the second semiconductor 14 together with the driver unit 15 are able to build at least one predefined current-over-time-curve. Especially the driver unit 15 and the second semiconductor 14 are embodied to build a pulse-width modulation of the current in the first conductor path 2. According to an additional further preferred embodiment, the driver unit 15 further can drive the first semiconductor 12 to be turned on, if the source voltage is below the minimum required source voltage at source connection 3 and neutral connection 6. In this case the driver unit 15 can drive the first and the second semiconductor 12, 14 to create a time-current curve so that define over-current time characteristics can be provided In the FIGS. 3 and 4 embodiments are shown of an electric switching device (or low-voltage protective device) comprising a residual-current device 10. Preferably the residual-current device 10 is a voltage independent residual current detection device (VI RCD). The electric switching device 30 and the residual-current device 10 are part of a low-voltage protective device 1. Preferably, these arrangements of the residual-current device 10 further comprise a galvanic separation relay 9 The galvanic separation relay 9 may be a normally closed (i.e. normally on) galvanic separation relay 9, as it is shown in FIG. 3, or a normally open galvanic separation relay 9, when arranged in accordance with the embodiment shown in FIG. 4. Though not shown, a further galvanic separation relay can be arranged in the second conductor path 5. In these embodiments the galvanic separation relay 9 is driven by a further relay driver 24, as shown in the embodiment of FIG. 4. The voltage independent residual-current device 10 can be connected with the power supply 18 for voltage dependent actuation. The electric switching device 30 typically comprises at least one current measuring device 23 arranged in the first conductor path 2 and one voltage measurement between 2 and 5.

Due to combination of inclusion of a voltage independent residual current device 10, over currents, short-circuit currents and residual currents can be detected and interrupted by the low-voltage protective device 1, whereby the low-voltage protection device 1 can be self-powered when the supply voltage is not sufficient to activate internal power supply of low-voltage protective device 1. In particular, if a residual current flows in the first conductor path 2 the residual current is detected and interrupted by the voltage independent residual-current device 10. Once the mechanical contacts 101, 102 of the VI RCD 10 are driven to open the circuit, the residual current may be further used to activate the second control and driver unit 15 to turn off the second semiconductor 14. As such, the first and second mechanical contacts 101, 102 of the VI RCD can open at no current conditions. The residual current, such as 30 to 100 mA, might not sufficient to generate adequate voltage droop on 14 to activate 15. The RCD 10 includes a summation current transformer which is not shown in Figures. The summation current coming from the transformer is used to generate a voltage droop on a resistor which is connected parallel to the secondary side of the summation transformer, which is used to drive a relay which activates opening mechanism of the 10. Once the mechanical contacts 101, 102 of the VI RCD are opened, there is still residual current flowing in the summation transformer. The current is then used to activate the second control and driver unit 15 to turn off the second semiconductor switch 14. In particular, if an overcurrent or an short-circuit current occurs, this fault current is detected and interrupter by the voltage drop on the second semiconductor 14 due to sufficient voltage building up on 14 as overcurrents and fault currents are significantly larger than nominal current of the low voltage protective device 30. Therefore, a voltage independent low-voltage protective device 30 can be provided with voltage independent residual current, over current and short-circuit current protection even when the supply voltage is not sufficient to activate control and power supply unit 18

Further the voltage drop on the second semiconductor 14 could—in the described low-voltage protection device 1—also be used to trip the voltage independent residual-current device 10 in case of a fault detection, so that an air-gap can be provided by the residual-current device 10. This would cause a safe isolation in case of a fault. Furthermore, if the control and power supply unit 18 is active, the control and power supply unit 18 can trip the voltage independent RCD 10 to open its mechanical contacts to provide a safe isolation in case of an overcurrent or short circuit current detected by the control and power supply unit 18 unit via current measurement.

FIG. 3 shows a further embodiment of a low-voltage protective device, which is able to provide fault protection functionality in response to a number of fault conditions in a voltage independent mode and a voltage dependent mode. The low-voltage protective device of FIG. 3 comprises a first semiconductor circuit arrangement 11 having a first semiconductor switch 12 and a second semiconductor switch 14 arranged in parallel. First semiconductor switch 12 is normally-off and, preferably, comprises an insulated-gate bipolar transistor (IGBT). Second semiconductor switch 14 is normally-on and, preferably, comprises a SiC FET. First semiconductor switch 12 is controlled by non-self-powered first control and driver unit 13, which has a connection to a power supply 18 that provides power for its operation. Second semiconductor switch 14 is controlled at least in part by self-powered second control and driver unit 15.

The second control and driver unit 15 and second semiconductor 14 are configured to turn off the normally-on second semiconductor 14 in a short-circuit condition or overcurrent condition without external power. For example, in a short circuit condition, a large voltage is generated across both the semiconductor 14 and the driver unit 15. This large voltage can be used to power the self-powered second control and driver unit 15 to turn "off" the normally-on second semiconductor 14. This voltage can be used by the second control and driver unit 15 so that the normally-on semiconductor can be turned off. Once the second semiconductor switch 14 is turned off, it remains in off-state due to the fact that now the voltage available at of the source 3 and neutral connection 6 appears directly on the second semiconductor switch 14 and the second control and driver unit 15. As a result of this, the second control and driver unit 15 can keep the second semiconductor switch 14 in off-state. Nevertheless, the second control and driver unit 15 uses this voltage to active the VI RCD 10 to open its contacts so that we provide safe isolation. First semiconductor switch 12 may be turned on by second control and driver unit 5 in certain overcurrent conditions to let through overcurrents in accordance with defined time-current curve characteristics. The first control and driver unit 13 also controls the second semiconductor switch 14 to be in off-state when the power supply and control unit 18 is active.

The first semiconductor arrangement 11 is disposed on a first conductor path 2 having a first power supply connection 3 at a first end and an output connection 4 at a second end. A mechanical bypass relay 8 is disposed in parallel with the first semiconductor arrangement 11. A normally closed galvanic separation relay (NC GSR) 26 is connected in series along the first conductor path 2 with the first semiconductor arrangement 11 and bypass relay. The galvanic separation relay is either mono-stable or magnetically latched bi-stable relay. The bypass relay is controlled by individual relay driver 19. The NC GSR is controlled by individual GSR relay driver 24. First control and driver unit 13, individual relay driver 19 and GSR relay driver 24 are all supplied with power by a power supply unit 18, which is connected to the source voltage. The control and power supply unit 18 may comprise control circuitry allowing it to send control signals to the non-self-powered driver unit 13, the individual relay driver 19, the GSR relay driver 24, and a VI RCD 10. The control and power supply unit 18 may measure a current passing through the conductor path 2 and a voltage between the conductor path 2 and a neutral conductor path that runs through the electric switching device 30 from a neutral connection 6 to a neutral load connection 7. In this case, when the control and power supply unit 18 is not active due to low supply voltage, the bypass relay 8 is in open state and NC GSR is in closed state.

The VI RCD 10 is connected in series between the NC GSR 26 and the output terminal 4. The VI RCD 10 comprises a conductive coil 25, also known as a summation transformer, disposed around the conductor path 2 and the neutral conductor path 5. The neutral current path provides a return path for current provided through current path 2. A difference between the current in the first current path 2 and the neutral conductor path 4 due to a residual current is detected by the conductive coil and powers the VI RCD. Upon detecting the residual current, the VI RCD opens a first electromechanical RCD switch 101 in the first conductor path and a second electromechanical RCD switch 102 in the neutral conductor path. As the VI RCD is powered by the residual current of the circuit, the first and second electromechanical RCD switches can be activated during failure of the power supply unit 18. The VI RCD may also be connected to the second control and driver unit 15 to allow control of the second semiconductor switch 14 when a residual current is detected.

The above described circuit provides a range of functionality in normal operating conditions and under various fault conditions, as described in detail below.

Voltage Independent Functionality

The circuit of FIG. 3 operates in a voltage independent mode when the source voltage is insufficient to activate the control and power supply unit 18 (or to otherwise supply power to the first control and driver unit 13, and the driver units 19 and 24. Under these conditions, the first non-self-powered control and driver unit 13 does not provide control signals to the first and second semiconductor switches. In the voltage independent mode, the NC GSR, and the first and second electromechanical RCD switches are closed. The bypass relay is open.

In the absence of a fault condition, normally-off first semiconductor 12 switch is reverts to its default off-state, as no power is supplied to the first control and driver unit 13 by the control and power supply unit 18. The normally-on second semiconductor switch 14 reverts to its default on-state. A complete circuit path is provided between the input 3 and 6 and the output 4 and 7 via the second semiconductor switch 14, the NC GSR 26, and the first electromechanical RCD switch 101 and 102.

The complete current path between the input and output allows the device to function without a power supply in the absence of a detected fault condition. By this arrangement, the presently disclosed subject matter makes it possible to have voltage independent circuit protection, residual current device, safe isolation and remote control capability which is based on power electronics switching for both hybrid and solid-state circuit breaker topologies.

Fault: Residual Current

When a residual current has been detected (during use or testing) the current detected by conductive coil 25 of the VI RCD causes the first and second electromechanical switches to open. In some embodiments, voltage power generated by electronic circuit of VI RCD, activates the self-powered second control and driver unit 15 to turn off the second semiconductor 14, creating another break in the connection between the input and the output (i.e. between the source and the load). This is advantageous, as the switching off of the second semiconductor switch 14 can occur faster than the opening of the first and second electromechanical RCD switches due to the inherent inertia within the RCD mechanics/contacts. The voltage generated by the coil 25 and its electronic circuit first triggers opening of the contacts 101 and 102 which takes usually 10 to 20 ms to have open contacts. Once the contacts start to move, the residual current still continues to flow through coil 25 and the summation current is still available. This current is then used to activate driver 15 so that the contacts 101 and 102 can open without current conditions which makes it possible to use same contacts also in DC where no zero crossing is present.

Fault: Short Circuit

A short circuit causes a voltage drop across the second semiconductor switch 14 and the self-powered second control and driver unit 15. This causes the self-powered second control and driver unit 15 to be activated and turn off second semiconductor switch 14. After turning off second semiconductor switch 14, the voltage across the self-powered second control and driver unit 15 allows the self-powered second control and driver unit 15 to open the first and second electromechanical switches of the residual current device 10 by simulating a residual current in the circuit. Once the first and second eletromechanical switches are open, the circuit achieves safe isolation and the second semiconductor switch 14 reverts to the normally-on position due to the removal of the voltage on the driver 15. The VI RCD may be reclosed manually or with a remote reclosing mechanism.

Fault: Overcurrent Condition

In an overcurrent condition, the voltage drop across the second semiconductor switch 14 and the self-powered second control and driver unit 15 causes the second semiconductor switch 14 to turn off. Preferably, the second semiconductor switch 14 has a small active semiconductor area in order to achieve high sensitivity so that, even at small currents, a sufficient voltage drop across the second semiconductor device 14 occurs so that driver 15 can be activated. According to the time-current characteristics of various electrical fault protection specification, a circuit breaker should let through some time limited over-currents. However, the small active semiconductor area of the second semiconductor switch can lead to thermal run-away for conducting currents according to certain time-current curves (such as type B).

For overcurrent conditions allowed within a specified time-current curve, the self-powered driver unit 15 can be configured such that the voltage drop across the second semiconductor switch 14 and the self-powered second control and driver unit 15 is large enough to activate the not-self powered first control and driver unit 13 to turn on the normally-off first semiconductor switch 12, so that both the first and second semiconductor switches 12, 14 can conduct the allowed over-currents in parallel. The first semiconductor switch 12 is comprises a sufficient semiconductor area to conduct and turn-off relatively high fault currents during hybrid operation during a short circuit event on solid-state switching to provide low on-state losses at normal current conditions In case of an overcurrent condition exceeding the specified time-current curve (such as an excessively long overcurrent or a short circuit), self-powered second control and driver unit 15 turns off the first and second semiconductor switches 12, 14 and sends a trigger signal to activate opening the first and second electromechanical RCD switches. During the over-current conduction phase, the second semiconductor 14 can be turned so that only first semiconductor 12 conducts the current. Nevertheless, the 15 is still active due to voltage drop on 12.

Voltage Dependent Functionality

The circuit of FIG. 3 operates in a voltage dependent mode when the source provides sufficient voltage to activate the internal control and power supply unit 18.

In the absence of a fault condition, during normal voltage dependent operation, the normally-on second semiconductor switch device 14 is controlled by not-self-powered first control and driver unit 13 to be turned off. During the switching on operation of the electric switching device 30, the VI RCD 10 is in on-state (or "closed") and control and power supply unit 18 controls the relay driver 24 to keep contacts of NC GRS open to provide safe isolation. Initially, the NC GSR 26 is driven to close its contacts. Subsequently, the first semiconductor switch 12 is driven to go from an off-state to on-state. If an over-current or short-circuit current is detected by the control and power supply unit 18 via current measurement device 23, the first semiconductor switch 12 is driven to go immediately from on-state the to-off state. Finally the NC GSR 26 is opened to provide safe isolation. In this case the bypass relay 8 is not driven to be closed. If no fault detected, the bypass relay 8 is driven to close its contact so that the load current flows through low ohmic contacts of the bypass relay 8. The 30 is solid-state switching (without 8), then the current still flows thru the first semiconductor switch 12.

During a switching off operation, firstly the bypass relay 8 is driven to open its contacts, which results in current commutation from bypass relay 8 to first semiconductor switch 12. Once the bypass relay 8 has sufficient contact opening, the first semiconductor 12 is turned off, causing the voltage increase in circuit due to energy stored in line and stray inductances. This voltage increase is clamped the overvoltage protection device OPV which brings current to zero. Once current is around zero amperes, the NC GSR 26 is driven to open its contacts to provide safe galvanic isolation. In some embodiments, these drivers may be controlled remotely, allowing the circuit breaker to be switched on and off remotely. The VI RCD 10 remains closed in the absence of a fault condition unless the breaker is on state.

Fault: Residual Current

When a residual current is been detected by VI RCD block 10, the VI RCD causes the first and second electromechanical switches to open. In some embodiments, the VI RCD provides a trigger to GSR relay driver 24 to open the NC GSR 26. Safe isolation of a load from the source is either provided by the NC GSR and or by first and second electromechanical switches. The use of the NC GSR to achieve isolation is advantageous as it allows the circuit to be remotely reclosed where this functionality is desired.

Fault: Short Circuit

Under a short circuit condition, the internal control and power supply unit 18 detects a fault by measuring an excessive current passing through the first conductor path 2 via current measurement device 23 such as a shunt resistor. Upon detection of the short circuit condition, the opening mechanism of the low voltage protective device is activated. Firstly, the bypass relay 8 is driven to open its contacts which results in current commutation from bypass relay 8 to first semiconductor switch 12. Once the bypass relay 8 has sufficient contact opening, the first semiconductor switch 12 is turned off causing the voltage increase in circuit due to energy stored in line and stray inductances. This voltage increase is clamped the overvoltage protection device OPV which brings current to zero. Once current is around zero amperes, the NC GSR 26 is driven to open its contacts to provide safe galvanic isolation.

Fault: Overcurrent During an overcurrent condition, the bypass relay 8, the NC GSR 26 and the first and second electromechanical contacts 101 and 102 conduct the overcurrent while it remains within a specified time-current curve. Once the over current becomes a short circuit, the low voltage protective device is driven to realize opening operation. Firstly, the bypass relay 8 is driven to open its contacts which results in current commutation from bypass relay 8 to first semiconductor switch 12. Once the bypass relay 8 has sufficient contact opening, the first semiconductor switch 12 is turned off causing the voltage increase in circuit due to energy stored in line and stray inductances. This voltage increase is clamped the overvoltage protection device OPV which brings current to zero. Once current is around zero amperes, the NC GSR is driven to open its contacts to provide safe galvanic isolation.

FIG. 4 illustrates a modification of the embodiment shown in FIG. 3 where a normally open galvanic separation relay (NO GSR) is used instead of normally closed galvanic separation relay (NC GSR).

In the embodiment of FIG. 4, the NO GSR is connected after the RI RCD in the circuit. The device comprises two additional output connections 21 and 22. While the presently disclosed subject matter has been particularly shown and described with reference to exemplary embodiments thereof, it will be understood by those skilled in the art that various changes in form and details may be made therein without departing from the spirit and scope of the present invention as defined by the appended claims. The exemplary embodiments should be considered as descriptive only and not for purposes of limitation. Therefore, the scope of the present invention is not defined by the detailed description but by the appended claims.

Hereinafter are principles for understanding and interpreting the actual disclosure.

Features are usually introduced with an indefinite article "one, a, an". Unless otherwise stated in the context, therefore, "one, a, an" is not to be understood as a numeral.

The conjunction "or" has to be interpreted as inclusive and not as exclusive, unless the context dictates otherwise. "A or B" also includes "A and B", where "A" and "B" represent random features.

By means of an ordering number word, for example "first", "second" or "third", in particular a feature X or an object Y is distinguished in several embodiments, unless otherwise defined by the disclosure of the presently disclosed subject matter. In particular, a feature X or object Y with an ordering number word in a claim does not mean that an embodiment of the presently disclosed subject matter covered by this claim must have a further feature X or another object Y.

An "essentially" in conjunction with a numerical value includes a tolerance of ±10% around the given numerical value, unless the context dictates otherwise.

For ranges of values, the endpoints are included, unless the context dictates otherwise.

16

The invention claimed is:

1. An electric switching device, comprising:
   a first conductor path arranged between a power source and a load;
   a first semiconductor circuit arrangement of the electric switching device arranged in the first conductor path, the first semiconductor circuit arrangement comprising:
      at least a first semiconductor switch, wherein the first semiconductor switch is a normally-off semiconductor switch;
   a first control and driver unit configured to drive the first semiconductor circuit arrangement with control signals, wherein the first control and driver unit is connected to an internal power supply unit which is connected to the first conductor path;
   at least a second semiconductor switch, wherein the second semiconductor switch is connected parallel to the first semiconductor switch, and wherein the second semiconductor switch is a normally-on semiconductor; and
   a second control and driver unit configured to drive the second semiconductor switch with control signals when the internal power supply unit is not active or is incapable of supplying power to the first control and driver unit,
   wherein the second control and driver unit is connected in parallel to the second semiconductor switch, and
   wherein the second control and driver unit is configured to be powered by a voltage across the second semiconductor switch and the second control and driver unit during a short circuit condition or an overcurrent condition.

2. The electric switching device according to claim 1, wherein the second control and driver unit is configured such that it does not receive power from the internal power supply unit.

3. The electric switching device according to claim 1, further comprising a second conductor path and a voltage-independent residual current device, the voltage-independent residual current device having at least one switchable mechanical contact along the first conductor path in series with the first semiconductor circuit arrangement, the voltage-independent residual current device being configured to break the circuit by opening the at least one mechanical contact when the voltage-independent residual current device detects a residual current between the first conductor path and the second conductor path.

4. The electric switching device according to claim 3, wherein the voltage-independent residual current device is configured to send a signal to the second control and driver unit on detection of a residual current causing the second semiconductor switch to turn off.

5. The electric switching device according to claim 3, wherein the voltage-independent residual current device is connected to the internal power supply.

6. The electric switching device according to claim 1, wherein the first control and driver unit is configured to turn on the first semiconductor switch in the absence of a fault condition when provided with sufficient power from the internal power supply unit.

7. The electric switching device according to claim 1, wherein the first control and driver unit is configured to turn off the first semiconductor switch when a fault condition is detected.

8. The electric switching device according claim 1, wherein the second control and driver unit is configured to detect the overcurrent condition falling within a specified time-current curve and, based on detecting the overcurrent condition falling within the specified time-current curve, provide power and a signal to the first control and driver unit to turn on the first semiconductor switch.

9. The electric switching device according to claim 1, wherein the second control and driver unit is configured to switch off the second semiconductor switch if a source voltage at the first conductor path is under a predefined level and if the first control and driver unit is in a deactivated state, and if a fault current is flowing at least in the first conductor path.

10. The electric switching device according to claim 1, wherein a mechanical bypass switch is arranged in the first conductor path, the mechanical bypass switch is connected in parallel to the first semiconductor circuit arrangement.

11. The electric switching device according to claim 1, wherein the first semiconductor circuit arrangement is connected via a rectifier with the first conductor path.

12. The electric switching device according to claim 1, wherein the first semiconductor circuit arrangement is a bridge circuit.

13. The electric switching device according to claim 1, wherein the first control and driver unit is connected to the second control and driver unit and/or the second semiconductor switch.

14. The electric switching device according to claim 1, wherein the first semiconductor switch is an IGBT or enhancement-FET.

15. The electric switching device according to claim 1, wherein the second semiconductor switch is an JFET.

16. The electric switching device according to claim 1, further comprising a voltage-independent residual-current device.

17. The electric switching device according to claim 16, wherein the voltage-independent residual-current device is connected to the second control and driver unit which is configured to activate the second control driver unit when detecting a residual current.

18. The electric switching device according to claim 16, wherein the internal power supply unit is configured to trigger opening of contacts of the voltage-independent residual-current device by simulating a residual current to provide safe isolation in case of detection of overcurrent and or short circuit current conditions.

19. The electric switching device according to claim 1, further comprising at least a first normally-closed galvanic separation relay arranged in the first conductor path.

20. The electric switching device according to claim 1, further comprising a normally open galvanic separation relay arranged in the first conductor path of the electric switching device.

21. The electric switching device according to claim 20, wherein the normally open galvanic separation relay is disposed between a voltage independent residual current device and the load, and wherein an additional output connection is disposed between the voltage independent residual current device and the normally open galvanic separation relay.

22. The electric switching device according to claim 1, wherein the electric switching device is formed as a complete circuit breaker built in a common house.

23. The electric switching device according to claim 1, wherein, when the internal power supply unit is not active or is incapable of supplying power, the second control and driver is configured to activate the first control and driver unit to turn on the normally-off first semiconductor switch during overcurrent conditions within a predefined time-current curve.

24. The electric switching device according to claim 1, wherein the first control and driver unit is configured to control the second semiconductor switch when the internal power supply unit supplies sufficient power to activate the first control and driver unit.

25. The electric switching device according to claim 1, wherein the first control and driver unit is connected with the second control and driver unit and configured to deactivate the second control and driver unit when the internal power supply unit supplies sufficient power to activate the first control and driver unit.

* * * * *